United States Patent
Ong et al.

(10) Patent No.: US 7,599,180 B2
(45) Date of Patent: Oct. 6, 2009

(54) AIR BAFFLE WITH INTEGRATED TOOL-LESS EXPANSION CARD ATTACHMENT

(75) Inventors: Brett C. Ong, San Jose, CA (US);
Michael T. Milo, Los Altos, CA (US);
Quyen T. Vu, Menlo Park, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 112 days.

(21) Appl. No.: 11/949,491

(22) Filed: Dec. 3, 2007

(65) Prior Publication Data
US 2009/0141441 A1    Jun. 4, 2009

(51) Int. Cl.
H05K 7/20 (2006.01)
H05K 7/16 (2006.01)

(52) U.S. Cl. ............... 361/679.51; 361/679.49; 361/679.32; 361/679.46; 361/720; 361/721

(58) Field of Classification Search ........ 361/687, 361/690, 679.46, 679.49, 679.51, 679.32, 361/720, 721
See application file for complete search history.

(56) References Cited

U.S. PATENT DOCUMENTS

| | | | | |
|---|---|---|---|---|
| 5,218,514 A | * | 6/1993 | Huynh et al. | 361/679.47 |
| 5,375,038 A | * | 12/1994 | Hardt | 361/694 |
| 5,597,035 A | * | 1/1997 | Smith et al. | 165/80.3 |
| 5,630,469 A | * | 5/1997 | Butterbaugh et al. | 165/80.3 |
| 5,704,212 A | * | 1/1998 | Erler et al. | 62/3.2 |
| 5,813,243 A | * | 9/1998 | Johnson et al. | 62/259.2 |
| 5,914,858 A | * | 6/1999 | McKeen et al. | 361/695 |
| 5,963,424 A | * | 10/1999 | Hileman et al. | 361/695 |
| 6,288,898 B1 | * | 9/2001 | Johnson et al. | 361/679.49 |

(Continued)

FOREIGN PATENT DOCUMENTS

EP    1545179 A1 *   6/2005

(Continued)

*Primary Examiner*—Anatoly Vortman
(74) *Attorney, Agent, or Firm*—Osha • Liang LLP

(57) ABSTRACT

An air baffle with an integrated expansion card attachment is disposed in a computer for receiving an expansion card having a handle attached thereto. The air baffle includes a first wall including a first guide and a second guide projecting from a side surface of the first wall. The first guide a second guide form a transverse space therebetween. The air baffle includes a second wall parallel to the first wall disposed a distance from the first wall approximately equal to a width of the expansion card. The second wall includes a snap retainer having a projected portion thereof. The transverse space formed between the first and second guides of the first wall has a size approximately equal to a thickness of the expansion card such that a first end of the expansion card is firmly held by the first guide and the second guide when the expansion card is inserted into the transverse space. The projected portion inserts between the handle attached to the expansion card and the expansion card in order to hold the expansion card in place. The expansion card is held apart from and parallel to a circuit board of a computer such that an air channel is created between the first wall and the second wall for air to pass across the circuit board of the computer and the expansion card.

20 Claims, 8 Drawing Sheets

U.S. PATENT DOCUMENTS

| | | | |
|---|---|---|---|
| 6,490,153 B1 * | 12/2002 | Casebolt et al. | 361/679.33 |
| 6,876,549 B2 * | 4/2005 | Beitelmal et al. | 361/692 |
| 6,970,353 B2 * | 11/2005 | Brovald et al. | 361/679.5 |
| 7,180,740 B2 * | 2/2007 | Li et al. | 361/697 |
| 7,372,695 B2 * | 5/2008 | Coglitore et al. | 361/679.48 |
| 7,447,021 B2 * | 11/2008 | Chen | 361/695 |
| 7,460,375 B2 * | 12/2008 | Randall et al. | 361/724 |
| 2002/0054479 A1 * | 5/2002 | Wu | 361/695 |
| 2003/0021088 A1 * | 1/2003 | Jensen et al. | 361/687 |
| 2003/0202326 A1 * | 10/2003 | Toh | 361/690 |
| 2004/0001320 A1 * | 1/2004 | Baar et al. | 361/727 |
| 2004/0037033 A1 * | 2/2004 | Brewer | 361/687 |
| 2005/0041392 A1 * | 2/2005 | Chen | 361/695 |
| 2006/0176663 A1 * | 8/2006 | McEwan | 361/687 |
| 2006/0176664 A1 * | 8/2006 | Casebolt | 361/687 |
| 2007/0008699 A1 * | 1/2007 | Strmiska et al. | 361/687 |
| 2007/0121286 A1 * | 5/2007 | Foster et al. | 361/687 |
| 2008/0043405 A1 * | 2/2008 | Lee et al. | 361/600 |
| 2009/059519 A1 * | 3/2009 | Ong et al. | 361/690 |

FOREIGN PATENT DOCUMENTS

| | | | |
|---|---|---|---|
| JP | 04094195 A | * | 3/1992 |
| JP | 04142764 A | * | 5/1992 |

* cited by examiner

AIR BAFFLE WITH INTEGRATED TOOL-LESS EXPANSION CARD ATTACHMENT

BACKGROUND

FIG. 1 shows a perspective view of a typical computer 100 where a top cover (not shown) of a chassis 101 is removed. As can be seen in FIG. 1, various kinds of electronic parts 102 are disposed on a circuit board 103 of the computer 100. The circuit board 103 is disposed on a bottom surface of the chassis 101 via supports 105.

FIG. 2 shows a perspective view of the computer 100 in FIG. 1 where an expansion card 201 and the attachment part 206 are installed. As can be seen in FIG. 2, similar to the circuit board 103 of the computer 100, the circuit board 203 of the expansion card 201 has various kinds of electronic parts 202 thereon.

The chassis 101 includes an attachment part 206. Attachment part 206 is constituted by a left side surface of chassis 101 and a wall 207 disposed in the middle of the chassis 101. The supports 205 and 208 are disposed on a left and right end of the circuit board 203 of the expansion card 201, and the support 205 and 208 are disposed on the end surface of the circuit board 203, for example, by screws (not shown). Also, the supports 205 and 208 are attached to the chassis 101 and the wall 207 respectively, for example, by screws (not shown) so that the expansion card 201 is installed in the chassis 101.

SUMMARY OF INVENTION

One or more embodiments of the present invention relate to an air baffle with an integrated expansion card attachment for receiving an expansion card having a handle attached thereto, the air baffle comprising: a first wall comprising a first guide and a second guide projecting from a side surface of the first wall, wherein the first guide a second guide form a transverse space therebetween; and a second wall parallel to the first wall disposed a distance from the first wall approximately equal to a width of the expansion card, wherein the second wall comprises a snap retainer having a projected portion thereof, wherein the transverse space formed between the first and second guides of the first wall has a size approximately equal to a thickness of the expansion card such that a first end of the expansion card is firmly held by the first guide and the second guide when the expansion card is inserted into the transverse space, wherein the projected portion inserts between the handle attached to the expansion card and the expansion card in order to hold the expansion card in place, and wherein the expansion card is held apart from and parallel to a circuit board of a computer such that an air channel is created between the first wall and the second wall for air to pass across the circuit board of the computer and the expansion card.

One or more embodiments of the present invention relate to a computer system comprising: a circuit board disposed within a chassis; an air baffle with an integrated expansion card attachment disposed within the chassis; an expansion card having a handle attached thereto; wherein the air baffle comprises: a first wall comprising a first guide and a second guide projecting from a side surface of the first wall, wherein the first guide a second guide form a transverse space therebetween; and a second wall parallel to the first wall disposed a distance from the first wall approximately equal to a width of the expansion card, wherein the second wall comprises a snap retainer having a projected portion thereof, wherein the transverse space formed between the first and second guides of the first wall has a size approximately equal to a thickness of the expansion card such that a first end of the expansion card is firmly held by the first guide and the second guide when the expansion card is inserted into the transverse space, wherein the projected portion inserts between the handle attached to the expansion card and the expansion card in order to hold the expansion card in place, and wherein the expansion card is held apart from and parallel to a circuit board of a computer such that an air channel is created between the first wall and the second wall for air to pass across the circuit board of the computer and the expansion card.

Other aspects and advantageous of the invention will be apparent from the following description and appended claims.

DETAILED DESCRIPTION

Figure 1:
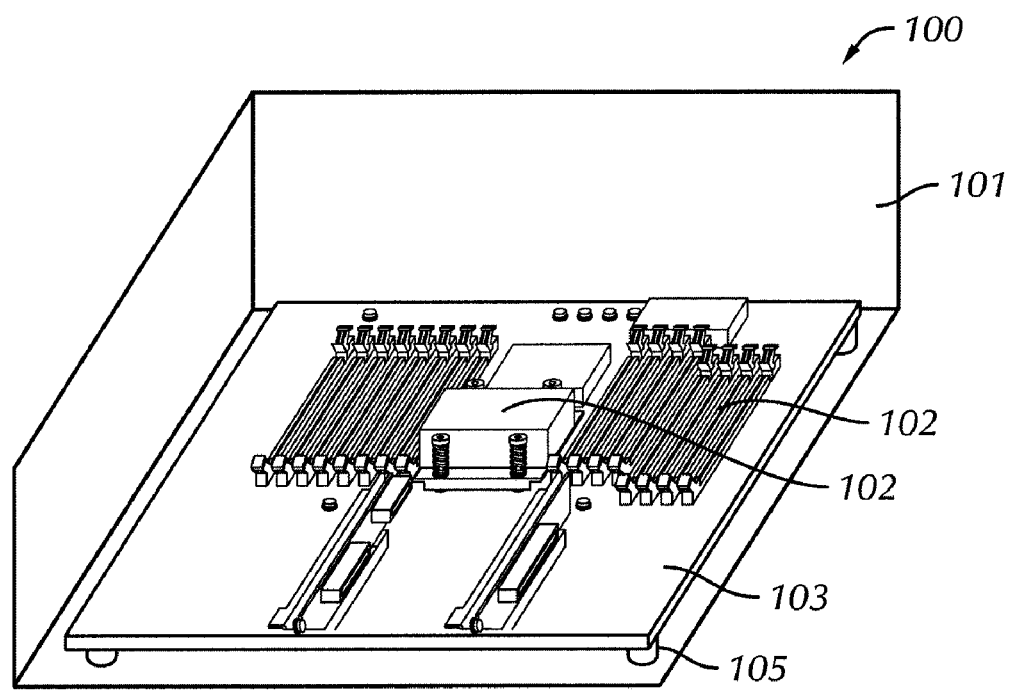
FIG. 1 shows a perspective view of a typical computer where a top cover of a chassis is removed.
Figure 2:
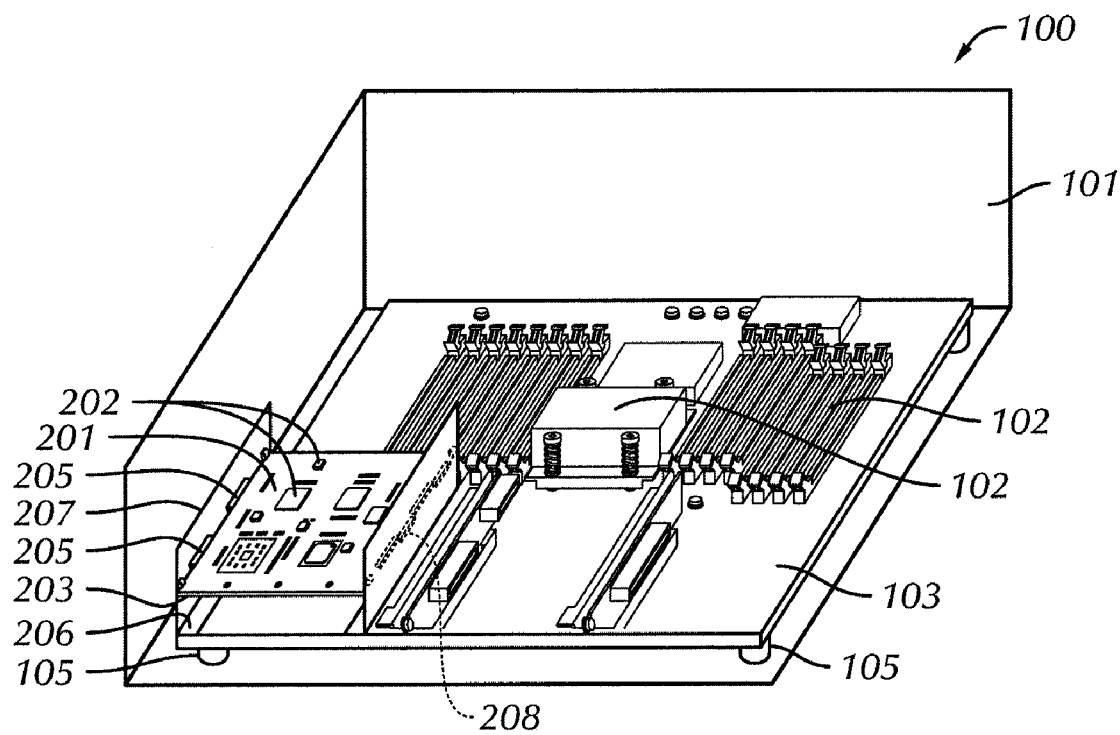
FIG. 2 shows a perspective view of a computer in FIG. 1 where an expansion card is installed.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 3:
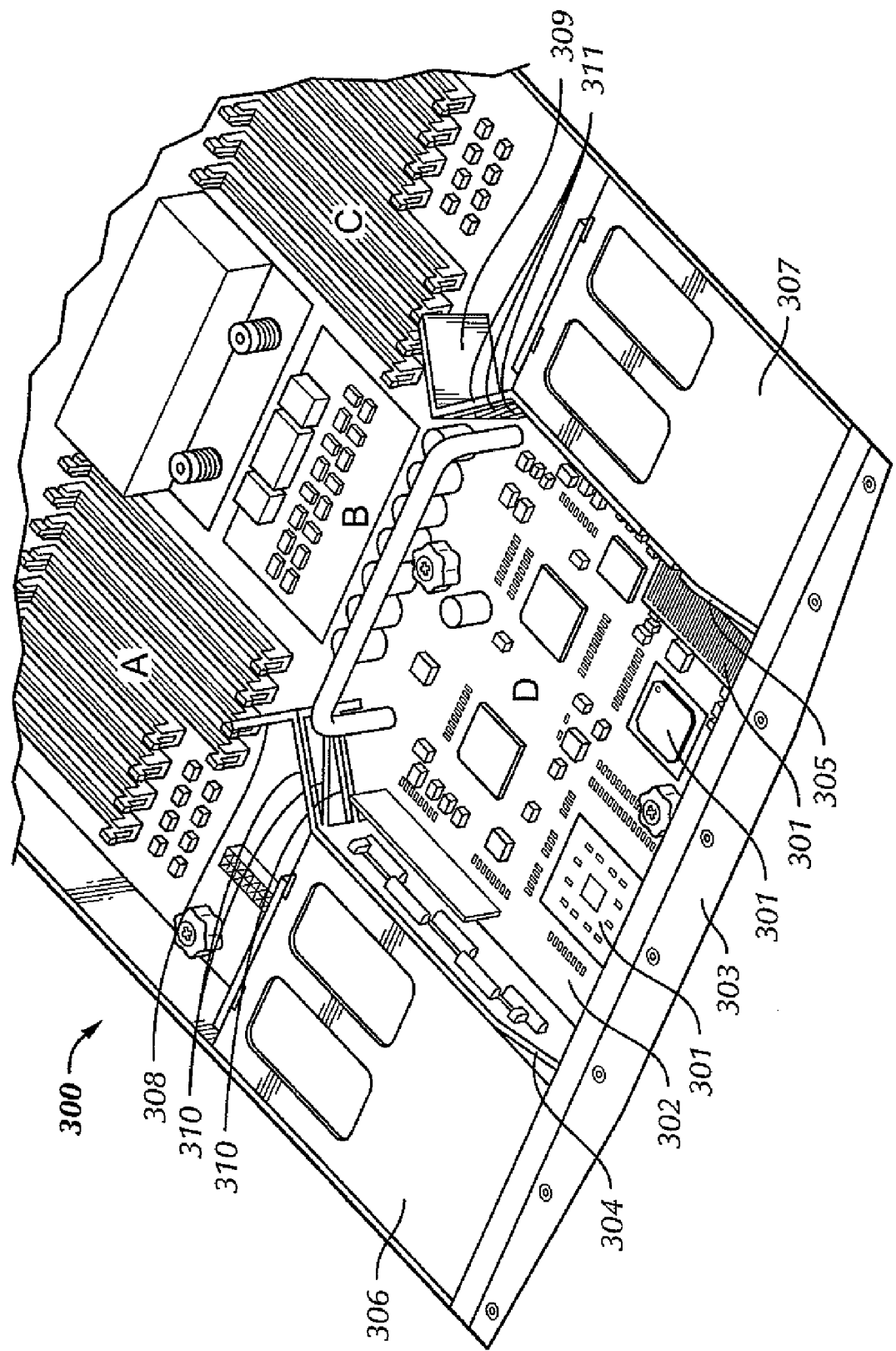
FIG. 3 shows a perspective view of the computer where a top cover of the chassis is removed.

FIG. 3 shows a perspective view of a part of computer 300 having an attachment for an expansion card before installing the expansion card (not shown). As can be shown in FIG. 3, a computer 300 has various kinds of electronic parts 301, components or units, such as integrated circuits, transistors, processors, heat sinks, connectors, etc. on the circuit board 302 of the computer 300. Such electronic parts, components or units 301 are enclosed in the chassis 303. In one or more embodiments, the present invention uses the circuit board 302 as a bottom wall, employs two side walls, and uses the expansion card itself as a top wall of an air channel for air to flow across the electronic components of the circuit board 302 and the expansion for cooling.

The attachment for an expansion card includes the first wall 304 and the second wall 305. The first wall 304 is disposed on the circuit board 302 of the computer 300 at a side of a slot 306 approximately perpendicular to the circuit board 302. Also, the second wall 305 is disposed on the circuit board 302 at a side of a slot 307 approximately perpendicular to the circuit board 302 and parallel to the first wall 304. The first wall 304 and the second wall 305 may be disposed on the circuit board 302 by screws, adhesives, bonding or other attachment methods known in the art. Also, one end of the first wall 304 is disposed at a side of the inside surface of the chassis 303. Similarly, one end of the second wall 305 is disposed at a side of the inside surface of the chassis 303. As a result, the part D of the circuit board 302 of the computer 300 is surrounded by the first wall 304, the second wall 305, and a part of the chassis 303. Further, the third wall 308 is attached to the first wall 304 by a plurality of rods 310. Similarly, the fourth wall 309 is attached to the second wall 305 by a plurality of rods 311.

Figure 4:
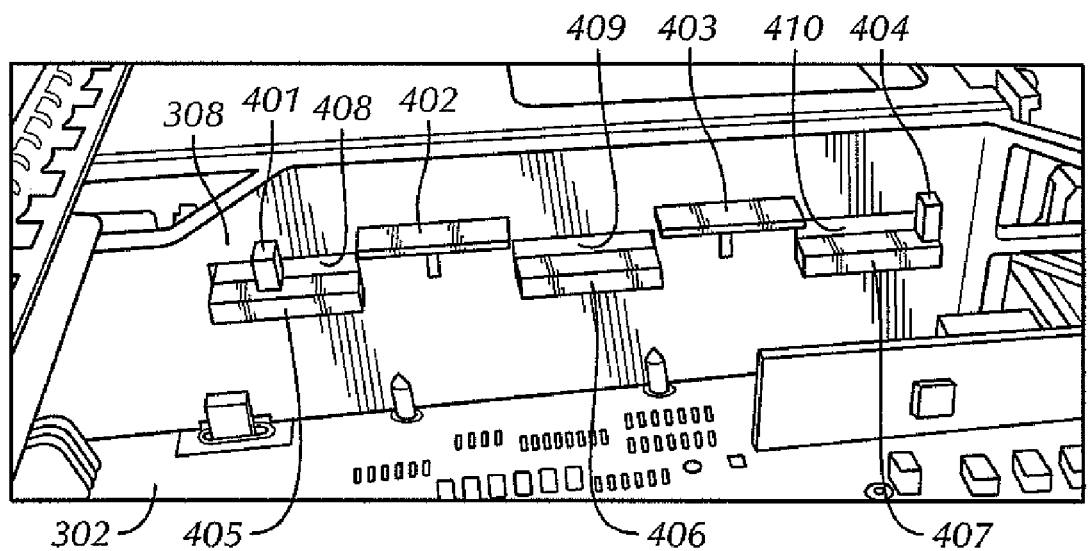
FIG. 4 shows an enlarged view of the first wall as shown in FIG. 3 including others.

FIG. 4 shows an enlarged view of FIG. 3 oriented towards the first wall. As can be shown in FIG. 4, the first wall 304 has a plurality of first guides 401-404 and a plurality of second guides 405-407. The first guides 401-404 and the second guides 405-407 are disposed on a side surface of the first wall 304 in a line at a different height respectively so that there is a transverse space horizontally between the bottom surface of the first guides 401-404 and the top surface of the second guides 405-407. The first guides 402 and 403 and the second guides 405-407 are disposed alternately along the each line. The width of this transverse space between the first guides 401-404 and the second guides 405-407 is approximately the same as the thickness of a circuit board of an expansion card as explained below. The shape and size of the second guides 405-407 are the approximately same as the first guides 402 and 403, but the first guides 401 and 402 are smaller than the second guides 405-407 in width. The first guide 401 is disposed above the second guide 405, and the first guide 404 is disposed above the end the second guide 407. In addition, the transverse space has openings 408-410 on the second guides 405-407. In one or more embodiments, the first and second guides 401-407 are formed integrally as a part of the first wall 304. One skilled in the art will appreciate that these guides could be separately formed and attached to the first wall.

Further, as explained above, the third wall 308 is attached to the first wall 304 by a plurality of rods 310. Specifically, as shown in FIG. 4, rods 310 include three rods 411-412. One end of the rod 411 is attached to one top end of the first wall 410, and one ends of rods 412 and 413 are attached in the middle of the other ends of the first wall 410 respectively. The rod 412 is approximately parallel to the first wall while the rods 411 and 413 have the same predetermined angle to the side surface of the first wall. Also, the rod 411 is parallel to the rod 413. The rods 411 and 413 and the rod 412 are crossed in the middle of the rods 411-413 in the air, and the other ends of the rods 411-413 are attached to the third wall 308 at the end thereof. Thus, the third wall 308 is supported in the air above the circuit board 302 at a predetermined angle to the side surface of the first wall 304. Because the fourth wall 309 is supported by the second wall 305 similarly although the direction of the rods 312 and the fourth wall 309 are opposite, as can be shown in FIG. 3, the explanation regarding the fourth wall 309 and the rods 312 are omitted.

One of the ordinary skilled in the art will appreciate that any other shapes or numbers of the first guides 401-404 and the second guides 405-407 may be used so long as the expansion card 600 is firmly held by these guides and the air passes smoothly when the expansion card 600 is installed, as described below. Also, one of the ordinary skilled in the art will appreciate other positions or numbers of the rods or ways to support the third and fourth wall 308 and 309 may be employed so long as the direction of the air is changed effectively by the third 308 and fourth wall 309 as explained below. In addition, there may be no openings 408-410 at the space between the first guides 401-404 and the second guides 405-407.

Figure 5:
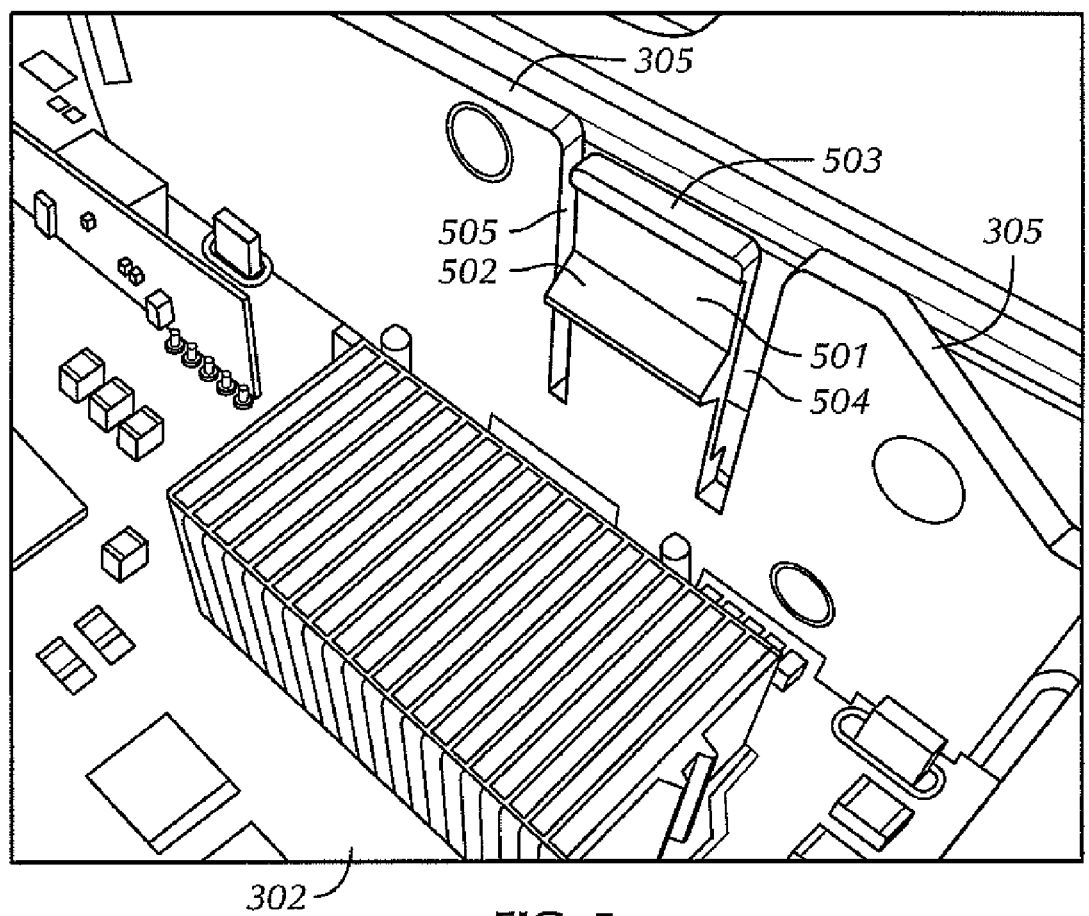
FIG. 5 shows an enlarged view of a part of the second wall, which shows a snap retainer.

FIG. 5 shows an enlarged view of a part of the second wall, which shows a snap retainer. As can be shown in FIG. 5, the snap retainer 501 is integrally formed as a part of the second wall 305. The snap retainer 501 is disposed parallel to the second wall 305, and the height and the thickness of the snap retainer 501 are approximately the same as the second wall 305. There are two cut outs 504 and 505 at the sides of the snap retainer 501 such that the snap retainer 501 is flexibly supported by the lower part of the second wall 305. Also, the snap retainer 501 itself may be flexible.

Further, the snap retainer 501 has a projected portion 502 in the middle upper part thereof which is disposed on the surface of the snap retainer 501 and parallel to the circuit board 307. The shape of the projected portion 502 is approximately triangle in the sectional view, and the width becomes narrower toward the tip of the projected portion 502. Furthermore, the position of the projected portion 502 to the circuit board 302 of the computer 300 is approximately the same as the position of the space between the first guides 401-404 and the second guides 405-407 so that the expansion card 600 is held approximately parallel to the circuit board 302 of the computer 300 when the expansion card 600 is attached, as described below. In addition, there is a thick portion 503 at the top of the snap retainer 501. Those skilled in the art will appreciate that the height at which the expansion card 600 is held above the circuit board 302 may vary depending on the type of computer 300 is involved.

One of the ordinary skilled in the art will appreciate that other shapes, sizes, or numbers of the projected portion 502 may be employed so long as the expansion card 600 is firmly held by the projected portion 502 and an air passes smoothly between the circuit board 302 of the computer 300 and the expansion card 600 as explained below. Also, in one or more embodiments, the projected portion 502 and the snap retainer 501 are formed integrally as a part of the second wall 305. However, the projected portion 502 and the snap retainer 501 may be separately formed and attached to the snap retainer 501 and the second wall 305.

Figure 6:
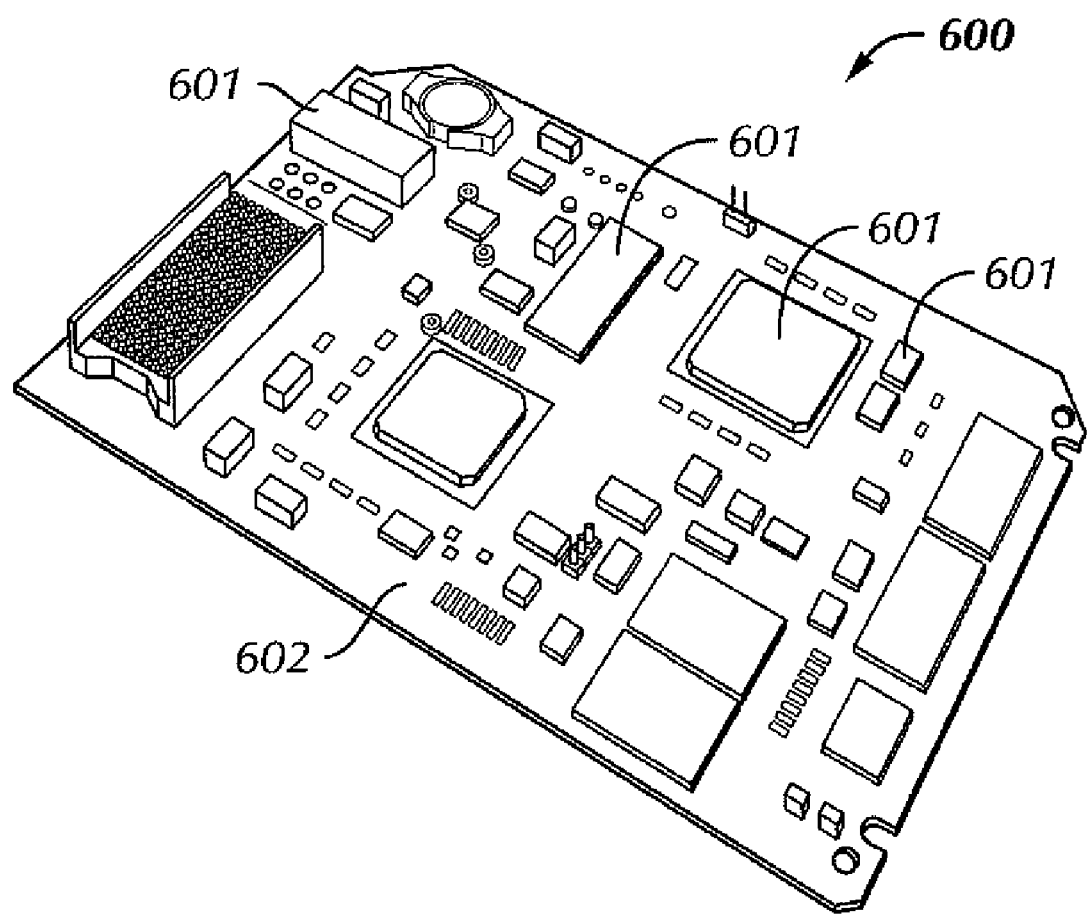
FIG. 6 shows a perspective view of an expansion card.
Figure 7:
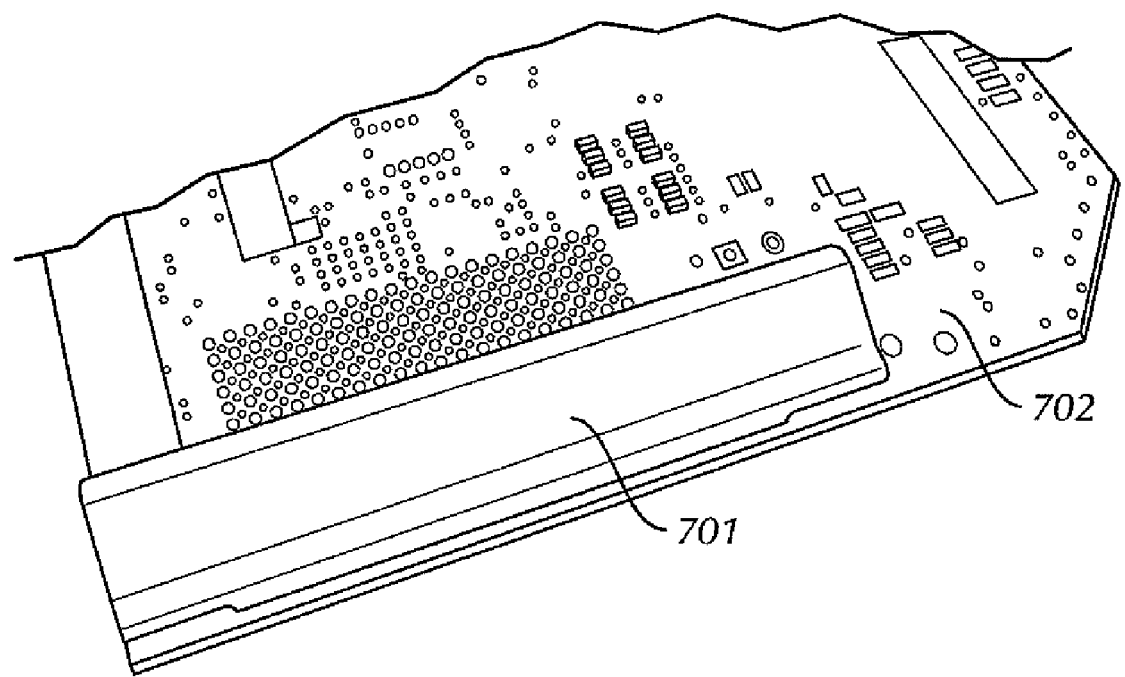
FIG. 7 shows a back surface of the expansion card, to which the handle is attached.
Figure 8:
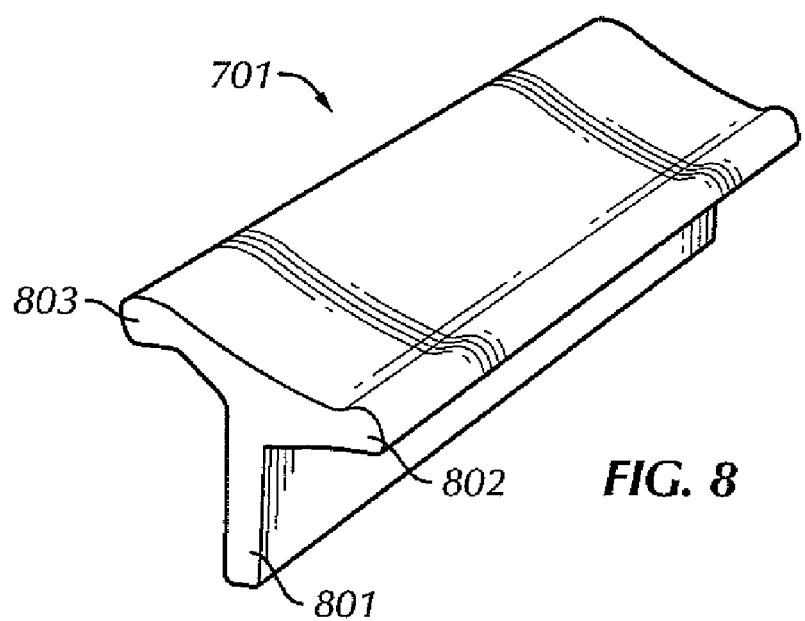
FIG. 8 shows a perspective view of the handle.

FIG. 6 shows a perspective view of an expansion card 600. FIG. 7 shows a back surface of the expansion card 600, to which the handle 701 is attached. FIG. 8 shows a perspective view of the handle 701. As can be shown in FIG. 6, various electronic parts 601 are disposed on the circuit board 602. As can be shown in FIG. 7, the handle 701 is attached to the back surface of the circuit board of the expansion card 600 at one end of the circuit board 602. As can be shown in FIG. 8, the handle 701 has a support 801, a guide portion 802, and a handle portion 803. The support 801 may be attached to the bottom surface of the circuit board 602 by screws, adhesives, bonding or other attachment methods known in the art. The distance between the guide portion 802 and the bottom surface of the circuit board 602 is longer than the distance between the handle portion 803 and the bottom surface of the circuit board 602. Thus, it is easily held by fingers using the handle portion 803. In addition, one of the ordinary skilled in the art will appreciate that other shapes, sizes, or numbers of handle 701 may be used so long as the expansion card 600 is firmly held by the projected portion 502 as described below.

Figure 9:
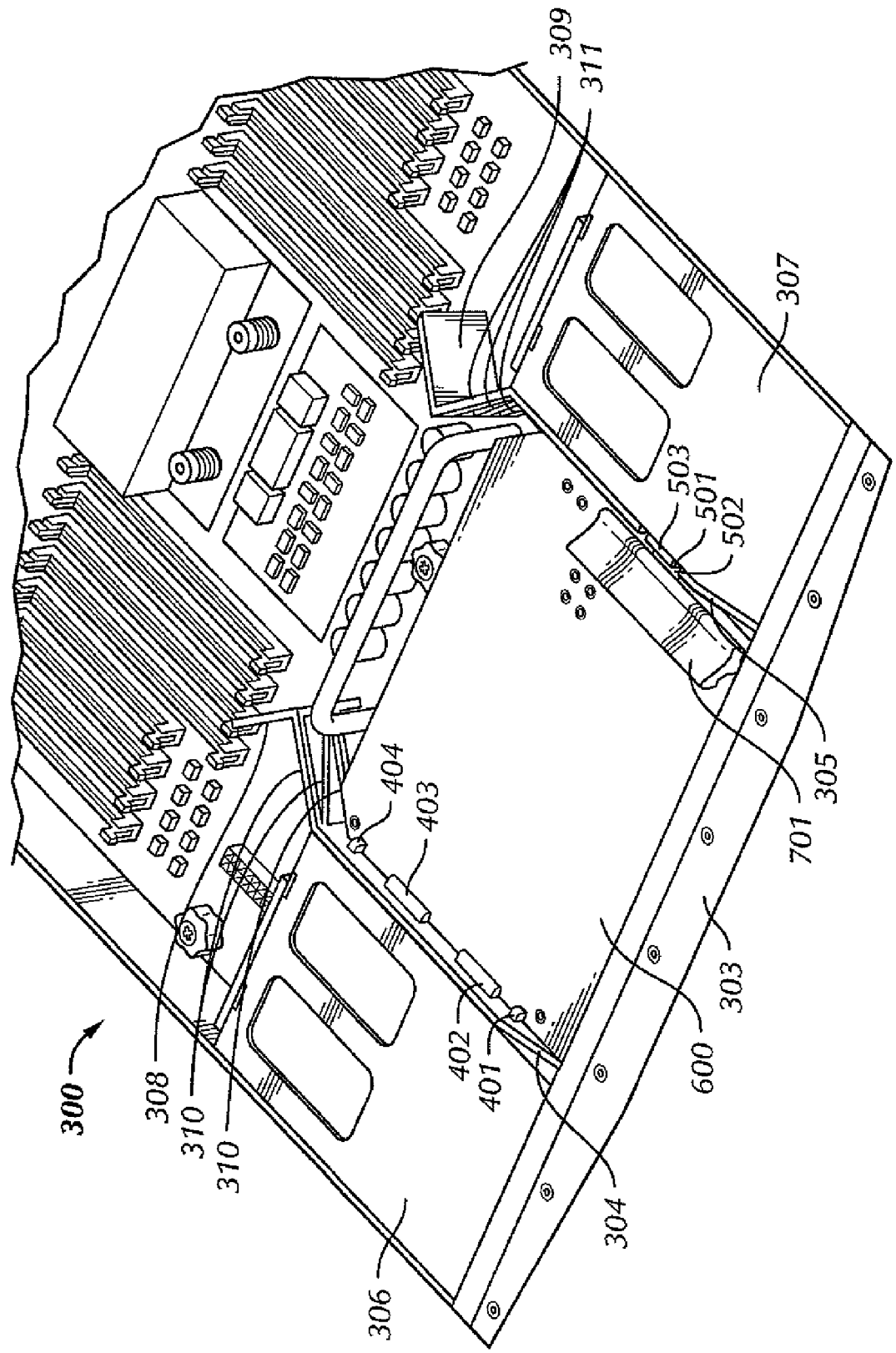
FIG. 9 shows a perspective view of the computer where the expansion card is installed.

FIG. 9 shows a perspective view of the computer where the expansion card 600 is installed. As can be seen in FIG. 9, the end circuit board 602 is inserted between the first guides 401-404 and the end the guides 405-407. Also, the projected portion 502 of the snap retainer 501 is inserted between the back surface of the circuit board 602 and the bottom surface of the guide portion 802 of the handle 701. As a result, the expansion card 600 is held firmly between the first wall 304 and the second wall 305 above and approximately parallel to the circuit board 302 of the computer 300 as described in detail below.

In operation, when the expansion card 600 is installed to the attachment, which includes the first wall 304 and the second wall 305, there is an opening between the circuit board 302 of the computer 300 and the circuit board 602 of the expansion card 600 so that an air passes between them smoothly and the ventilation of the computer 300 is improved. The use of the expansion card itself as a wall of air channel eliminates the need for a separate part and saves production cost. In one or more embodiments, the expansion card 600 is attached to the attachment facing downward such that the electronic parts 601 of the expansion card 600 are cooled by the air passing through the air channel. Further, as can be shown in FIG. 3, by the third wall 308 and forth wall 309, the air from the parts A-C gathers and enters into the part D shown in FIG. 3 where the expansion card 600 is installed. Thus, electronic parts 601 and 301 on the part D of the circuit board 302 and on the expansion card 600 are effectively cooled. In addition, the angle of the third wall 308 and forth wall 309 may be adjusted to effectively send the air from the parts A-C to the part D.

Figure 10:
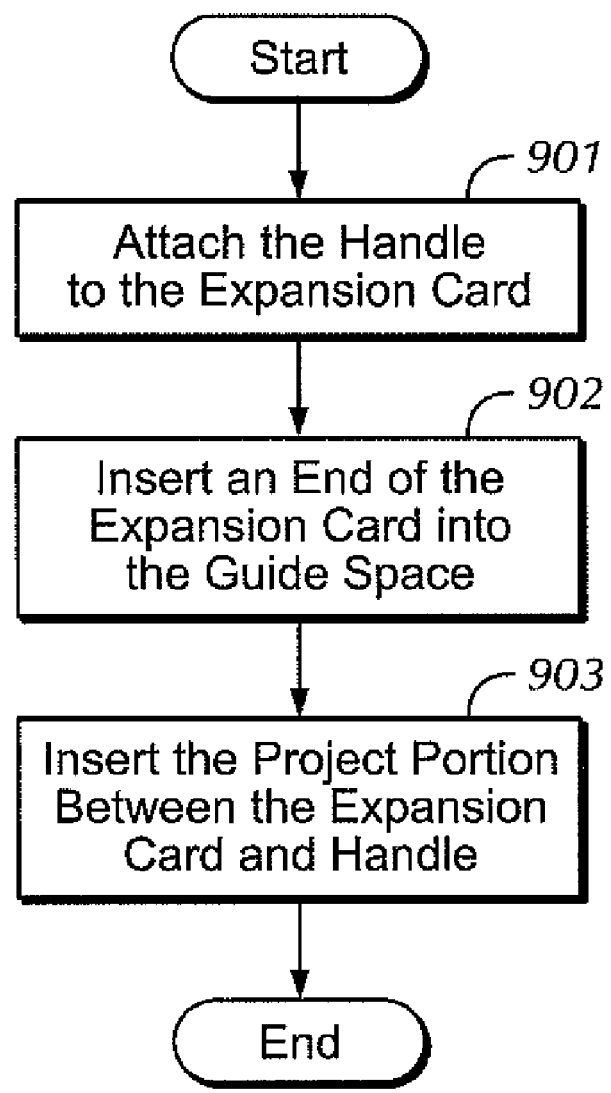
FIG. 10 shows a flow diagram of installing the expansion card.
Figure 11A:
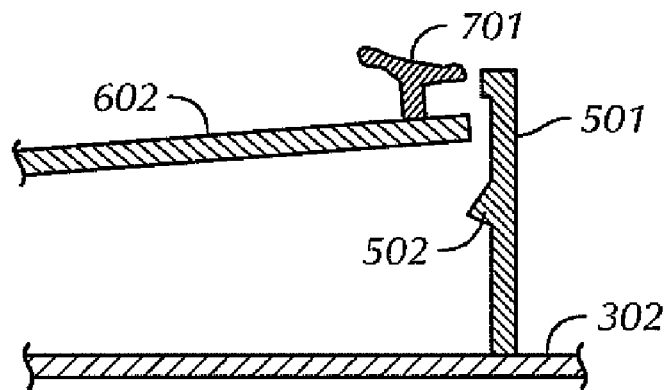
FIGS. 11(A)-(C) shows the expansion card and the snap retainer when installing the expansion card.
Figure 11B:
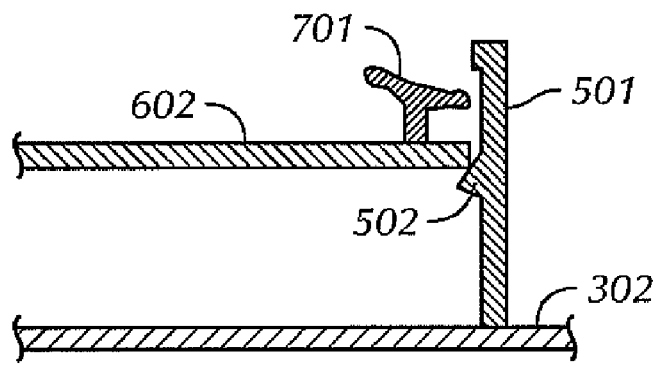
Figure 11C:
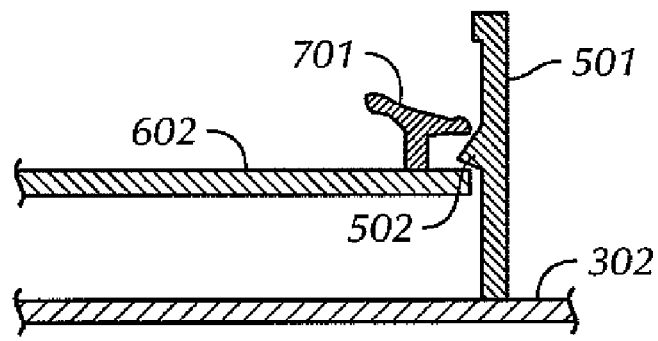

FIG. 10 shows a flow diagram of installing the expansion card to the computer. In one or more embodiments of the invention, one or more of the steps described below may be omitted, repeated, and/or performed in a different order. FIGS. 11 (A)-(C) show the expansion card 600 and the snap retainer 501 when installing the expansion card 600.

First, the handle 701 is attached to the back surface of the circuit board 602 of the expansion card 600 (Step 901). Second, one end of the expansion card 600, which does not have the handle 701, is inserted to the transverse space between the first guides 401-404 and the second guides 405-407 (Step 902). At this time, the other end of the expansion card 600 has not yet contacted to the projected portion 502 so that the snap retainer 501 is perpendicular to the circuit board 302 of the computer 300 as shown in FIG. 11 (A). Third, the other end of the expansion card 600 is pushed down toward the projected portion 502 using the handle portion 803 of the handle 701. While pushing down the expansion card, the projected portion 502 is moved back by the bottom surface of the expansion card 600 as shown in FIG. 11 (B) because the snap retainer 501 is flexibly held by the second wall 305. Then, the end of the circuit board 602 passes the tip of the projected portion 502, and, the projected portion 502 is finally inserted between the bottom surface of the guide portion 802 of the handle 701 and the top surface of the circuit board 602 as shown in FIG. 11 (C) (Step 903). At this time, because the snap retainer 501 is flexibly held by the second wall 305 and the shape of the projected portion 502 is triangle in the sectional view as explained above, the circuit board 602 of the expansion card 600 is firmly held by the projected portion 502 and the transverse space of the first wall 304.

In view of above, this attachment provides a simple, toolless, user-friendly mechanism for installing an expansion card. Also, the expansion card 600 is also used as a part of an air baffle when attached so that the electronic parts 301 and 601 of the computer 300 and the expansion card 600 are effectively cooled. Also, this use of the expansion card 600 to create an air channel within the air baffle allows for the improved use of the limited space in the chassis 303 of the computer 300. Further, this use of the expansion card 600 itself as a wall for defining the air channel reduces the number of the parts to form such an air baffle and reduces cost.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An air baffle with an integrated expansion card attachment for receiving an expansion card having a handle attached thereto, the air baffle comprising:
    a first wall comprising a first guide and a second guide projecting from a side surface of the first wall, wherein the first guide and the second guide form a transverse space therebetween; and
    a second wall parallel to the first wall disposed a distance from the first wall approximately equal to a width of the expansion card, wherein the second wall comprises a snap retainer having a projected portion thereof,
    wherein the transverse space formed between the first and second guides of the first wall has a size approximately equal to a thickness of the expansion card such that a first end of the expansion card is firmly held by the first guide and the second guide when the expansion card is inserted into the transverse space,
    wherein the projected portion inserts between the handle attached to the expansion card and the expansion card in order to hold the expansion card in place, and
    wherein the expansion card is held apart from and parallel to a circuit board of a computer such that an air channel is created between the first wall and the second wall for air to pass across the circuit board of the computer and the expansion card.

2. The air baffle of claim 1 further comprising a third wall attached to the first wall,
    wherein the third wall is configured to direct airflow from another portion of the computer into the air channel.

3. The air baffle of claim 2, further comprising a fourth wall attached to the second wall,
    wherein the fourth wall is configured to direct airflow from another portion of the computer into the air channel.

4. The air baffle of claim 2, wherein the third wall is attached to the first wall by a rod.

5. The air baffle of claim 3, wherein the fourth wall is attached to the second wall by a rod.

6. The air baffle of claim 1, wherein the snap retainer is integrally formed as a part of the second wall.

7. The air baffle of claim 6, wherein the snap retainer is located between two cut outs from a top of the second wall, and wherein the snap retainer is flexibly held by a lower part of the second wall between the two cut outs.

8. The air baffle of claim 1, wherein the projected portion has a triangular cross-section.

9. The air baffle of claim 1, wherein a width of the projected portion decreases from a base width at the snap retainer to a tip width at a tip of the projected portion.

10. The air baffle of claim 1, wherein the handle comprises:
    a support portion disposed on a surface of the expansion card;
    a guide portion disposed on the support portion; and
    a handle portion disposed on the support portion,
    wherein the guide portion is held by the projected portion of the snap retainer of the second wall when the expansion card is installed, and wherein the handle portion extends from the guide portion towards a direction away from the second wall.

11. A computer system comprising:

a circuit board disposed within a chassis;

an air baffle with an integrated expansion card attachment disposed within the chassis;

an expansion card having a handle attached thereto;

wherein the air baffle comprises:

a first wall comprising a first guide and a second guide projecting from a side surface of the first wall, wherein the first guide and the second guide form a transverse space therebetween; and a second wall parallel to the first wall disposed a distance from the first wall approximately equal to a width of the expansion card, wherein the second wall comprises a snap retainer having a projected portion thereof, wherein the transverse space formed between the first and second guides of the first wall has a size approximately equal to a thickness of the expansion card such that a first end of the expansion card is firmly held by the first guide and the second guide when the expansion card is inserted into the transverse space, wherein the projected portion inserts between the handle attached to the expansion card and the expansion card in order to hold the expansion card in place, and wherein the expansion card is held apart from and parallel to a circuit board of a computer such that an air channel is created between the first wall and the second wall for air to pass across the circuit board of the computer and the expansion card.

12. The air baffle of claim 11 further comprising a third wall attached to the first wall, wherein the third wall is configured to direct airflow from another portion of the computer chassis into the air channel.

13. The air baffle of claim 12, further comprising a fourth wall attached to the second wall, wherein the fourth wall is configured to direct air from another portion of the computer chassis to the air channel.

14. The air baffle of claim 12, wherein the third wall is attached to the first wall by a rod.

15. The air baffle of claim 13, wherein the fourth wall is attached to the second wall by a rod.

16. The air baffle of claim 11, wherein the snap retainer is integrally formed as a part of the second wall.

17. The air baffle of claim 16, wherein the snap retainer is located between two cut outs from a top of the second wall, and wherein the snap retainer is flexibly held by a lower part of the second wall between the two cut outs.

18. The air baffle of claim 11, wherein the projected portion has a triangular cross-section.

19. The air baffle of claim 11, wherein a width of the projected portion decreases from a base width at the snap retainer to a tip width at a tip of the projected portion.

20. The air baffle of claim 11, wherein the handle comprises:

a support portion disposed on a surface of the expansion card;

a guide portion disposed on the support portion; and a handle portion disposed on the support portion, wherein the guide portion is held by the projected portion of the snap retainer of the second wall when the expansion card is installed, and wherein the handle portion extends from the guide portion towards a direction away from the second wall.

* * * * *